United States Patent [19]
Yanagisawa

[11] Patent Number: 5,262,258
[45] Date of Patent: Nov. 16, 1993

[54] PROCESS OF MANUFACTURING SEMICONDUCTOR DEVICES

[75] Inventor: Masayuki Yanagisawa, Tokyo, Japan

[73] Assignee: NEC Corporation, Tokyo, Japan

[21] Appl. No.: 714,429

[22] Filed: Jun. 12, 1991

[30] Foreign Application Priority Data

Jun. 12, 1990 [JP] Japan ............................. 2-153777

[51] Int. Cl.⁵ ............................................. G03F 9/00
[52] U.S. Cl. .......................................... 430/22; 430/311; 430/319
[58] Field of Search .................... 430/22, 311, 319

[56] References Cited

U.S. PATENT DOCUMENTS

| | | | |
|---|---|---|---|
| 4,388,386 | 6/1983 | King et al. | 430/22 |
| 4,610,940 | 9/1986 | Araihara | 430/22 |
| 4,642,672 | 2/1987 | Kitakata | 430/22 |
| 4,806,457 | 2/1989 | Yanagisawa | 430/311 |
| 5,017,514 | 5/1991 | Nishimoto | 430/311 |

FOREIGN PATENT DOCUMENTS

| | | |
|---|---|---|
| 0370834 | 5/1990 | European Pat. Off. . |
| 62-115165 | 5/1987 | Japan . |
| 1-193743 | 8/1989 | Japan . |
| 3-058408 | 3/1991 | Japan . |

OTHER PUBLICATIONS

Patent Abstracts of Japan, vol. 11, No. 331, Oct. 29, 1987.
Patent Abstracts of Japan, vol. 13, No. 482, Nov. 2, 1989.
Patent Abstracts of Japan, vol. 15, No. 209, May 28, 1991.

*Primary Examiner*—Marion E. McCamish
*Assistant Examiner*—Mark A. Chapman
*Attorney, Agent, or Firm*—Sughrue, Mion, Zinn, Macpeak & Seas

[57] ABSTRACT

A process of manufacturing semiconductor devices includes a step of transferring on a surface of a semiconductor wafer by a step-and-repeat reduction projection system a pair of rotation error check patterns formed as a main scale and a vernier scale. In one form, the transfer also includes a pair of resolution check patterns disposed respectively adjacent to the main scale and the vernier scale. In another form, the process includes a first step of transferring a mask pattern including a main or a vernier alignment scale having an alignment check patterns and a second step of transferring, after the completion of said first step, another mask pattern including another main or vernier alignment scale having an alignment check patterns and this second step includes transferring of rotation error check patterns and resolution check patterns. The process includes a step of observing such patterns which enables to detect any rotation errors, resolution deficiency or alignment errors through microscopic fields of vision.

1 Claim, 3 Drawing Sheets

PROCESS OF MANUFACTURING SEMICONDUCTOR DEVICES

BACKGROUND OF THE INVENTION

The present invention relates to a process of manufacturing semiconductor devices and, in particular, to a process of transferring such patterns as rotation error check patterns, resolution check patterns and alignment check patterns used in a lithography process therefor.

The lithography process which is one of the steps of the semiconductor device manufacturing process requires that the pattern is formed to be precisely aligned with an underlying pattern and also that the pattern is formed in a predetermined size. In a step-and-repeat reduction projection system which is widely used in the lithography step or process, there occur, if the system is not properly adjusted, such problems as rotation errors in image formation patterns which are caused by rotation or movement of a reticle and as image surface curving or image surface slanting in which the image formation surface is not in parallel with the semiconductor wafer faces. Any of such problems make it impossible to achieve the desired patterns. It is necessary to discover such problems as they occur and to make sufficient and suitable adjustment.

With respect to the conventional step-and-repeat reduction projection system, such errors have been controlled through routine examination using a test reticle thereby confirming that no errors are beyond the desired precision limits in all ranges of projection.

However, by relying only on routine examination or inspection, there is a possibility that some disastrous abnormality or defects are built in during the manufacturing process by oversight of a step-and-repeat reduction projection system having problems and that the defective semiconductor devices thus made are processed to the next step leading to large manufacturing losses.

In addition, even if such problems do exist in the manufacturing step of the product as described above, they are often overlooked in other tests in other steps because such other tests having different judgment standards directed to an external appearance do not uncover such problems in the product, resulting in the defective product being discovered only in the last measurement test for the wafer step. Thus, such problems can lead to large losses.

SUMMARY OF THE INVENTION

It is, therefore, an object of the present invention to overcome the problems existing in the conventional process of manufacturing semiconductor devices, particularly such problems as rotation errors, alignment errors and resolution deficiency in a lithography process.

According to one aspect of the invention, there is provided a process of manufacturing semiconductor devices including:

a step of transferring on a surface of a semiconductor wafer by a step-and-repeat reduction projection system a pair of rotation error check patterns by themselves or together with a pair of resolution check patterns, the rotation error check patterns being formed as a pair of scales, one being a main scale disposed in a first scribe line region adjacent to and in parallel with a first side of a circuit region and the other being a vernier scale disposed in a second scribe line region adjacent to and in parallel with a second side of the circuit region opposite to the first side, and the resolution check patterns being formed as a first resolution check pattern and a second resolution check pattern disposed respectively adjacent to the main scale and the vernier scale; and a step of observing the rotation error check patterns and the resolution check patterns in a microscopic field of vision for detecting any rotation errors and any resolution deficiency on a resist film.

According to another aspect of the invention, the process includes a first step of transferring on a surface of a semiconductor wafer by a step-and-repeat reduction projection system a mask pattern including a main or a vernier alignment scale having an alignment check pattern whose lines, at least two lines, are at right angles to each other; a second step of transferring on the surface of the semiconductor wafer after the completion of the first step at least another mask pattern including another main or vernier alignment scale having an alignment check pattern paired to the first alignment check pattern, the second step including transferring of a pair of rotation error check patterns and a first and a second resolution check pattern, the pair of rotation error check patterns being formed as a pair of scales, one scale being a main rotation error check scale disposed in a first scribe line region adjacent to and in parallel with a first side of a circuit region and the other being a vernier rotation error check scale disposed in a second scribe line region in parallel with the first side and adjacent to the second side of the circuit region opposite to the first side, the first and second resolution check patterns being disposed respectively adjacent to the main rotation error check scale or the vernier rotation error check scale; and a step of observing the alignment check patterns, the rotation error check patterns and the resolution check patterns in microscopic fields of vision for detecting any alignment errors, rotation errors and resolution deficiency on a resist film.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Throughout the following explanation, similar reference symbols or numerals refer to the same or similar elements in all figures of the drawings.

Figure 1A:
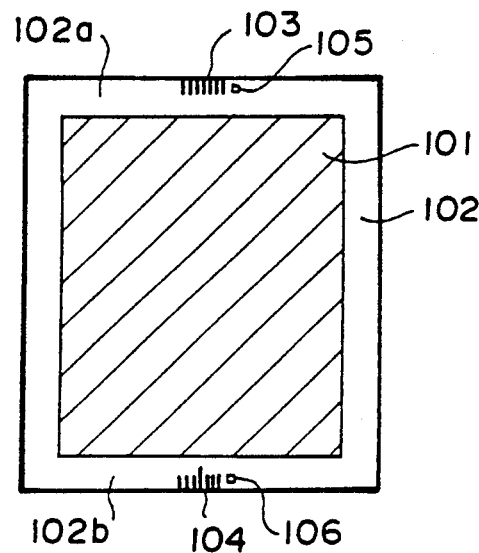
FIGS. 1A and 1B, respectively, are a plan view of a semiconductor chip and a plan view of a semiconductor wafer, illustrating a first embodiment of the present invention.
Figure 1B:
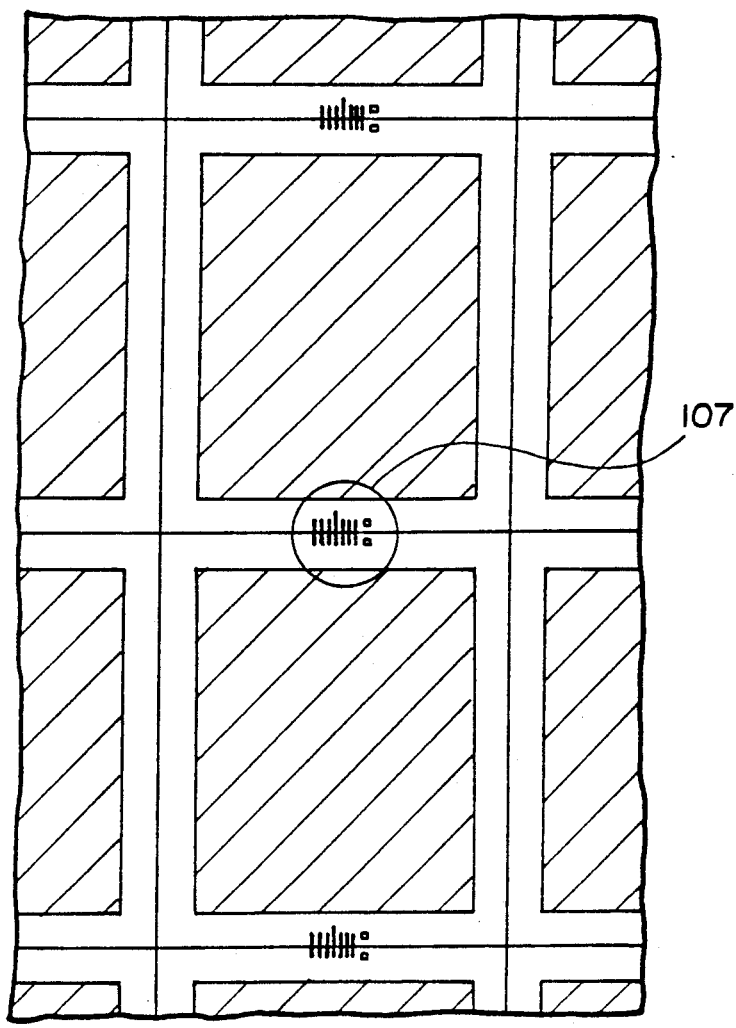

FIGS. 1A and 1B, respectively, are plan views of a semiconductor chip and a semiconductor wafer, which illustrate a first embodiment of the present invention.

FIG. 1A shows a state in which a main scale of the rotation error check patterns 103 is transferred to a central portion of a first side (upper side) of a scribe line region 102 disposed around a circuit region 101 of the semiconductor chip, a first resolution check pattern 105 is transferred to a location adjacent to the main scale of the rotation error check patterns 103, a vernier scale of the rotation error check patterns 104 is transferred to a central portion of a second side opposite to the first side of the scribe line region 102 and a second resolution check pattern 106 is transferred to a location adjacent to the vernier scale of the rotation error check patterns 104.

Next, FIG. 1B shows a part of the external appearance of the semiconductor wafer having semiconductor chips as shown in FIG. 1A and being processed as a part of the semiconductor manufacturing process. In a microscopic field of vision 107, there are observed a main scale of the rotation error check patterns 103 of a lower chip and a first resolution check pattern 105 adjacent to the main scale, a vernier scale of the rotation error check patterns 104 of an upper chip and a second resolution check pattern 106 adjacent to the vernier scale. In particular, it shows that the main scale and the vernier scale of the rotation error check patterns are disposed adjacent to each other and this facilitates the detection of rotation errors. Because, as mentioned above, it is possible to observe the rotation error check patterns 103, 104 and the two resolution check patterns 105, 106 in the same microscopic field of vision, these patterns can be checked without deteriorating operational efficiency in the checking process.

Figure 2A:
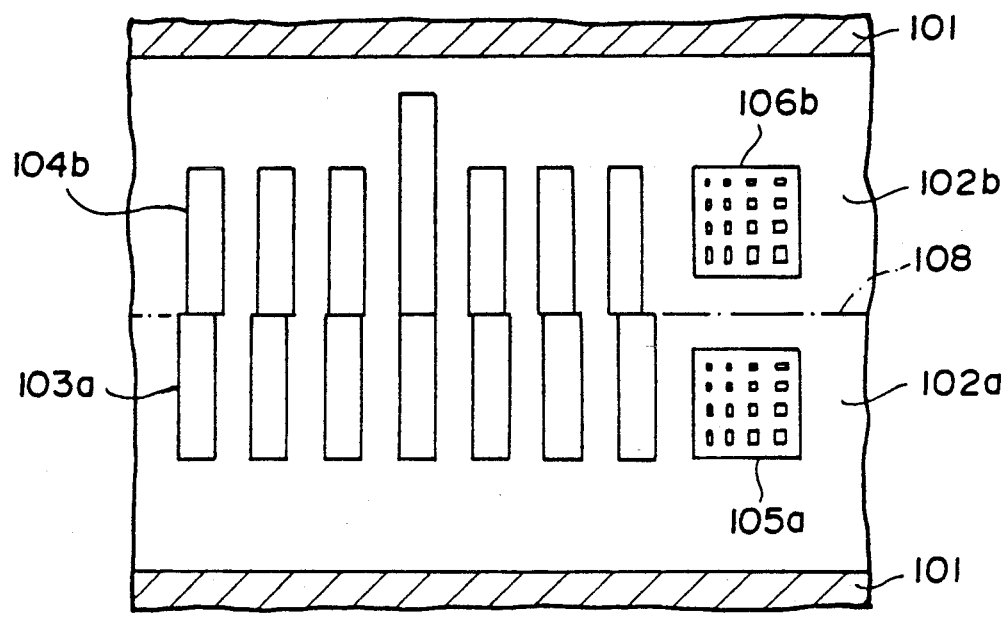
FIGS. 2A and 2B, respectively, are plan views of the semiconductor chip and the semiconductor wafer for illustrating the rotation errors check patterns and the resolution check patterns.
Figure 2B:
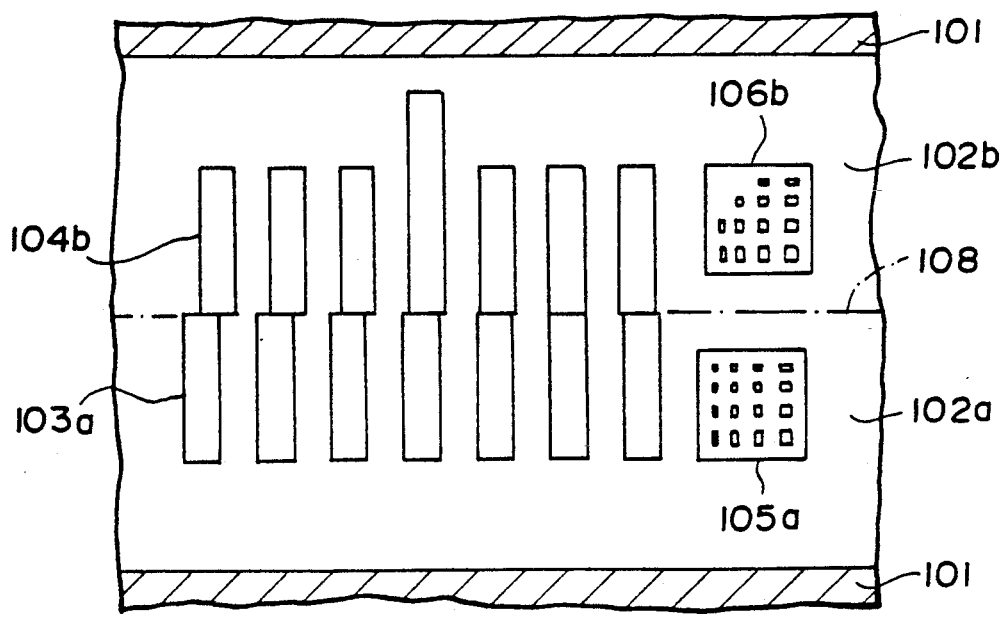

FIGS. 2A and 2B are enlarged views of the microscopic field of vision 107 mentioned above. FIG. 2A shows a state in which there is no rotation error and no problems in resolution.

In FIG. 2A, the first scribe line region 102a disposed around a circuit region 101 of the lower chip and the second scribe line region 102b disposed around the circuit region 101 of the upper chip are in contact with each other at the line 108.

The main scale of the rotation error check patterns 103a with a pitch 10 $\mu$m transferred on the first scribe line region 102a of the lower chip and the vernier scale of the rotation error check patterns 104b with a pitch 8.9 $\mu$m transferred on the second scribe line region 102b of the upper chip are in contact with each other at the line 108 with the respective central graduations of the patterns 103a and 104b completely matching each other, indicating that the rotation error check patterns show no rotation error. It is also shown that the first resolution check pattern 105a and the second resolution check pattern 106b have been transferred in the state in which the resolution of the patterns of 0.6 $\mu$m $\times$ 0.6 $\mu$m disposed adjacent to the main scale and the vernier scale of the rotation error check patterns is excellent.

FIG. 2B shows a state in which there is a rotation error and a lack of resolution in the upper chip. Where there are rotation errors, the rotation error check patterns as shown have the main scale 103a being in accord with the vernier scale 104b at the second graduation to the right of the center. Because the pitch of the main scale patterns is 10 $\mu$m and the pitch of the vernier scale patterns is 9.9 $\mu$m, it can be appreciated that the upper chip is shifted to the right by 0.2 $\mu$m relative to the lower chip. The second resolution check pattern 106a shows that the resolution of the 0.6 $\mu$m $\times$ 0.6 $\mu$m pattern in the upper chip is deficient.

Figure 3A:
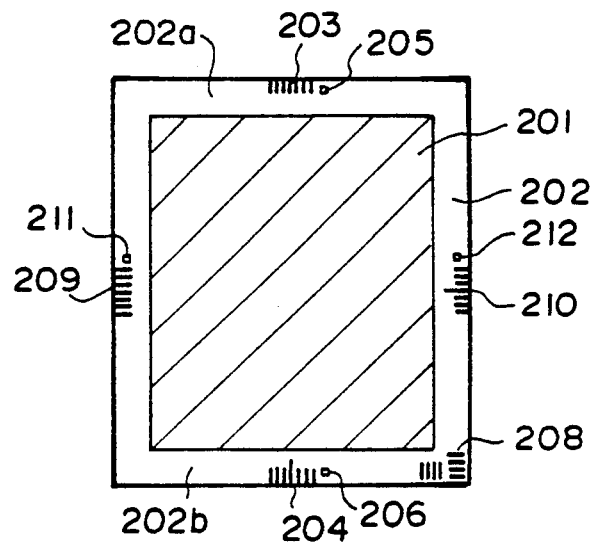
FIGS. 3A and 3B, respectively, are a plan view of a semiconductor chip and a plan view of the semiconductor wafer for illustrating a second embodiment of the present invention.
Figure 3B:
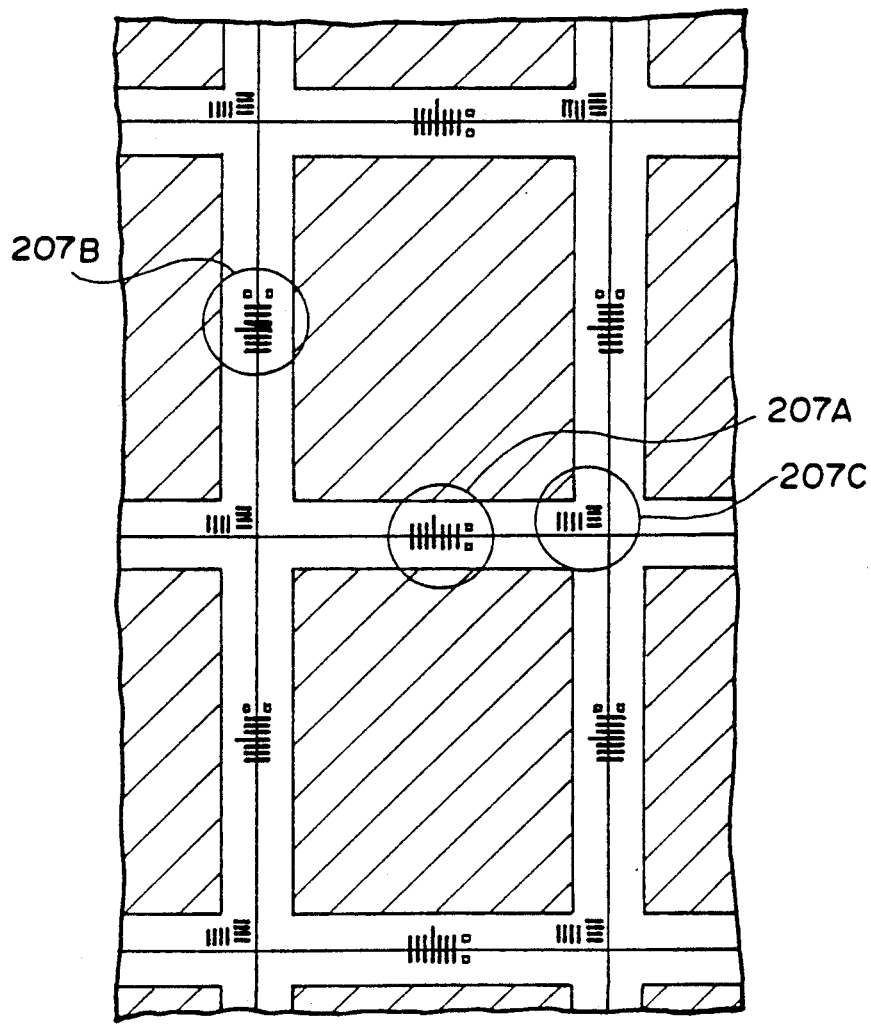

FIGS. 3A and 3B, respectively, show plan views of the semiconductor chip and the semiconductor wafer to be referred to in describing the second embodiment of the present invention.

That is, FIG. 3A shows a state in which the main scales 203 and 209, and the vernier scales 204 and 210 of the first and the second rotation check patterns as shown in FIG. 1A, and the first to fourth resolution check patterns 205, 206, 211 and 212 are transferred on the scribe line regions 202 disposed around the circuit region 201 of the semiconductor chip.

The arrangements different from those shown in FIG. 1A are that, to all four sides of the circuit region 201, a pair of the main scales 203, 209 or the vernier scales 204, 210 of the rotation error check patterns and the resolution check patterns 205, 206, 211, 212 are transferred, and that the main scale (or the vernier scale) 208 of the alignment error check patterns for alignment with the underlying pattern is transferred. In this case, if the vernier scale (or the main scale) of the alignment check patterns has correspondingly paired alignment check patterns transferred (or to be transferred) on the semiconductor wafer in the previous step (or next step) of lithography, it is possible to carry out an alignment check.

FIG. 3B shows a part of the external appearance of the semiconductor wafer having semiconductor chips as shown in FIG. 3A and being processed as a part of the manufacturing process. Through the first field of vision 207A of the microscope, it is possible to check the rotation error and the resolution at the site between the upper and the lower semiconductor chips adjacent to each other. Through the second field of vision 207B of the microscope, it is possible to check the rotation error and the resolution at a site between the right and left adjoining semiconductor chips. Also, through the third field of vision 270C of the microscope, it is possible to check the alignment error with respect to the underlying pattern.

As to the practical operation procedure of the checking process, first the rotation error and the resolution on a first semiconductor wafer are checked through the first and the second fields of the microscope. If it is confirmed that they are within the predetermined range of precision and there is no abnormal condition in the projection system in the particular lithography process of the particular manufacturing lot. Consequently, according to the present invention, it is sufficient if only two microscopic fields for one manufacturing lot are checked and this results in a more efficient checking operation as compared with a conventional checking operation which requires a checking of errors in alignment with an underlying pattern conducted through a third microscopic field of vision.

According to the present invention, it is possible as described above, to repeatedly check the state of a step-and-repeat reduction projection system by transferring check patterns for checking rotation error and resolution of at least one portion of a semiconductor wafer and confirming such check patterns in a manufacturing lot during a routine external appearance test of the semiconductor wafer. Consequently, if a certain manufacturing lot is found to have any problem or abnormal state, the projection system may immediately be examined in detail in order to prevent the problem from affecting another manufacturing lot. In addition, if any defective portion in a particular manufacturing lot is found in a lithography process in progress, it is possible to repair or reproduce the product by eliminating a defective resist. Accordingly, the present invention is effective in stabilizing, simplifying and rationalizing the manufacturing process of semiconductor devices.

Also, according to the present invention, since it is possible to observe the rotation error check patterns and the resolution check patterns in the same field of vision of a microscope, the necessary checks can be carried out without deteriorating operation efficiency.

It is also to be noted that the locations of the rotation check patterns, the resolution check patterns and the alignment check patterns are not limited to those specifically illustrated or explained with reference to the above embodiments of the invention. By changing such locations, it will be possible to observe both the rotation check patterns and the alignment check patterns in the same field of vision of a microscope or to observe all or any combination of the three patterns, namely, the rotation check patterns, resolution check patterns and the alignment check patterns.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A process of manufacturing semiconductor devices including:
   a step of transferring on a surface of a semiconductor wafer by a step-and-repeat reduction projection system a pair of rotation error check patterns and a pair of resolution check patterns, said rotation error check patterns being formed as a pair of scales, one being a main scale disposed in a first scribe line region adjacent to and in parallel with a first side of a circuit region and the other being a vernier scale disposed in a second scribe line region adjacent to and in parallel with a second side of said circuit region opposite to said first side, and said resolution check patterns being formed as a first resolution check pattern and a second resolution check pattern disposed respectively adjacent to said main scale and said vernier scale; and
   a step of simultaneously observing said rotation error check patterns and said resolution check patterns in a single field of vision of a microscope for detecting any rotation errors and any resolution deficiency on a resist film.

* * * * *